United States Patent [19]

Simpson et al.

[11] 4,006,437
[45] Feb. 1, 1977

[54] FREQUENCY FILTER

[75] Inventors: Harold A. Simpson, North Andover, Mass.; Edwin C. Thompson, West Epping, N.H.

[73] Assignees: Bell Telephone Laboratories, Incorporated, Murray Hill, N.J.; Western Electric Company, Inc., New York, N.Y.

[22] Filed: June 27, 1975

[21] Appl. No.: 590,901

[52] U.S. Cl. .................. 333/72; 310/8.2; 328/19; 330/174; 333/76
[51] Int. Cl.² .............. H03H 7/08; H03H 9/02
[58] Field of Search ........... 333/30 R, 71, 72, 76; 310/8.2; 328/16, 19; 329/117; 330/174; 331/76, 77, 155

[56] References Cited

UNITED STATES PATENTS

| | | | |
|---|---|---|---|
| 2,948,867 | 8/1960 | Mattiat | 333/72 |
| 2,973,489 | 2/1961 | Bradley | 333/76 |
| 3,281,725 | 10/1966 | Albsmeier | 310/9.8 X |
| 3,723,920 | 3/1973 | Sheahan et al. | 333/72 |
| 3,727,154 | 4/1973 | Dailing et al. | 333/72 |

*Primary Examiner*—Eugene La Roche
*Attorney, Agent, or Firm*—D. J. Kirk; D. D. Bosben

[57] ABSTRACT

A band-pass filter comprising a plurality of coupled electromechanical filters is disclosed. Each electromechanical filter has a frequency pass-band centered about a fundamental frequency and a plurality of higher frequency pass-bands which are centered about overtones of the fundamental frequency. At least one of the electromechanical filters has a fundamental frequency that is different from the other filters and all the filters have a common overtone frequency. The band-pass filter will pass all frequencies falling within the band about the common overtone frequency, while all other frequencies will be suppressed.

3 Claims, 7 Drawing Figures

FREQUENCY FILTER

BACKGROUND OF THE INVENTION

1. Field of the Invention

This invention relates to frequency filters. More particularly, the invention is directed to such filters formed by coupling a plurality of electromechanical filters to attain a high frequency filtering capability.

2. Description of the Prior Art

It is well known that electromechanical filters are preferred over filters using discrete resistive, capacitive and inductive components, for many applications. Such electromechanical filters are extremely accurate, repeatable and have inherent frequency stability as to temperature and time.

The instant invention can be readily understood by discussing the principles and concepts as they relate to a particular electromechanical filter — the Monolithic Crystal Filter — described in U.S. Pat. No. 3,564,463 to W. D. Beaver and R. A. Sykes which is assigned to Bell Telephone Laboratories, Incorporated, Murray Hill, New Jersey. Such as a crystal filter may be comprised of two pairs of aligned metallic electrodes plated on opposite faces of a piezoelectric quartz crystal wafer. Energy supplied to an input electrode pair at or near the shear mode fundamental frequency of the crystal wafer will piezoelectrically vibrate the wafer in the shear mode which will be sensed at an output pair of electrodes. Accordingly, only the frequencies corresponding to the fundamental and overtone frequencies of the crystal wafer and a limited band of frequencies about such frequencies will be transmitted from the input to the output of the filter. All other frequencies will be suppressed to a high degree.

Although there are other factors, the controlling contribution to the fundamental or resonant frequency of such a crystal filter is the thickness of the quartz crystal captured between the electrodes. The thickness of the quartz crystal wafer is inversely proportional to its fundamental frequency. Accordingly, the maximum fundamental frequency of the crystal filter is limited by the state of the quartz crystal lapping art. Presently, quartz crystal can be lapped to yield usable wafers having a fundamental frequency up to approximately 60 MHz. However, such wafers must be lapped to about 0.0011 inch (0.0028 cm) in thickness to attain such frequencies which makes such wafers very difficult to fabricate, delicate, subject to breakage and extremely expensive.

An alternative to using the fundamental frequency of a crystal filter to attain high frequency filtering capabilities (i.e., about 40 MHz) is to pass frequencies at a predetermined one of the overtone frequency bands of the crystal filter. However, this normally requires the use of additional LC filters to suppress input frequencies corresponding to the fundamental frequency and overtones that should not pass through the crystal filter.

SUMMARY OF THE INVENTION

The foregoing problems have been solved by the instant band-pass filter which comprises a plurality of coupled electromechanical filters, wherein at least one of the electromechanical filters has a fundamental frequency band different from the other filters. Each electromechanical filter has one overtone frequency band that is aligned, or coincides with, one overtone frequency band of all of the other coupled filters to permit only frequencies within that overtone frequency band common to all filters to pass, substantially unsuppressed, through the band-pass filter.

By coupling the electromechanical filters, the frequencies corresponding to the fundamental frequency band of each filter, as well as undesirable overtone bands thereof, which are presented to the input of the coupled combination will be suppressed by at least one of the other coupled filters. However, the input frequencies which correspond to the frequencies in the coincident overtone frequency band will pass through the coupled combination substantially uninhibited.

Advantageously such filters can be simply and economically fabricated with known crystal filter production methods.

Furthermore, transmission systems requiring filters for frequencies above approximately 40 MHz will no longer require external LC filtering to suppress undesired pass bands.

DETAILED DESCRIPTION OF THE INVENTION

The instant filter can be fabricated using a variety of mechanical or electromechanical resonators or filters. Electromechanical filters, such as tuning fork filters, crystal filters or the like, can advantageously make use of the instant inventive concepts. Any filter or resonator having a fundamental frequency and attendant overtones of such fundamental frequency can incorporate the instant inventive concepts. However, in an exemplary embodiment, applicants make use of a particular electromechanical filter known in the art as a monolithic crystal filter (MCF) which is fully described in the above-referred to Beaver et al. patent.

Figure 1:
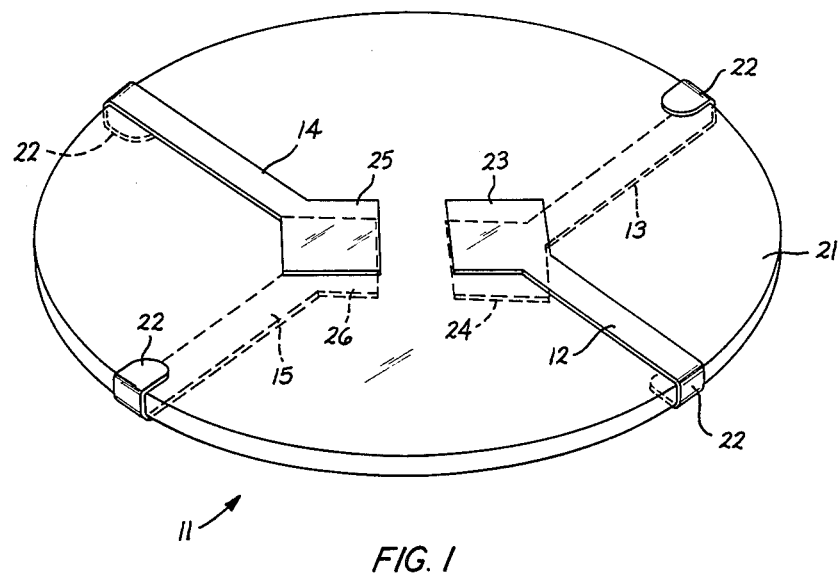
FIG. 1 is a perspective drawing of a piezoelectric monolithic crystal filter.

FIG. 1 shows such a MCF 11 in the form of a device having two pairs of leads 12, 13 and 14, 15 vapor deposited or otherwise plated on opposite major faces of a piezoelectric crystal wafer 21, such as an AT-cut quartz crystal. Land areas 22—22 of leads 12, 13, 14 and 15 extend across the edge of the wafer 21 to the opposite face thereof. This arrangement advantageously makes the land areas 22—22 accessible for electrical connection from either side of the MCF 11. The leads 12, 13, 14 and 15 terminate at electrodes 23, 24, 25 and 26, respectively. Each pair of electrodes 23, 24 and 25, 26, with a portion of the wafer 21 captured therebetween, form a resonator.

Energy supplied to the electrodes 25 and 26 at or near the shear mode fundamental frequency of the crystal wafer 21 will piezoelectrically vibrate the wafer in the shear mode which will be sensed by circuitry connected to the electrodes 23 and 24. In other words, when the MCF 11 is excited by an alternating electric current field, it exhibits physical dimensional changes which tend to have a characteristic or fundamental resonant frequency and a plurality of overtone frequencies which are multiples of the fundamental frequency. The size of the quartz crystal wafer 21, the manner in which the wafer is cut relative to its crystalline structure, and the extent and thickness of the electrodes 23, 24, 25 and 26 all combine to determine the natural or fundamental frequency and related overtones of the MCF 11.

The MCF 11 is commonly used as an alternating current frequency filter. For example, when a broad spectrum of frequencies is presented to the MCF 11, only a narrow band of frequencies, centered about the resonant or fundamental frequency or narrow bands centered about the overtones thereof, pass, unsuppressed, through the MCF.

Such MCF's 11 have found a high degree of use in telephone carrier and radio systems. However, the highest possible fundamental or resonant frequency of the MCF 11 is limited mainly by the thickness of the piezoelectric crystal wafer 21 which is inversely proportional to the fundamental frequency of the wafer.

Such MCF's 11 can be fabricated using standard production techniques for fundamental frequencies below 30 MHz. However, for fundamental frequencies above that value problems arise, due to the thinness required to obtain such high frequencies. For example, a MCF 11 having a fundamental frequency response of 54.6 MHz requires the crystal wafer thickness to be approximately 0.0012 inch (0.003 cm). The present state of the art for practical piezoelectric crystal plate production is in the neighborhood of 0.002 inch (0.005 cm), and for thinner crystal plates the cost is prohibitive and their reliability low.

One solution to this problem is to use a MCF 11 having a fundamental frequency response well below 30 MHz, which is relatively easy to fabricate. Then, a predetermined overtone of that fundamental frequency is selected for filtering purposes. Filters capable of passing frequencies well above 60 MHz have been fabricated using this principle. However, a substantial drawback to the use of such filters lies in the necessity of providing additional LC filtering to substantially preclude any response of such a filter to its fundamental frequency or unwanted overtones thereof.

Figure 2:
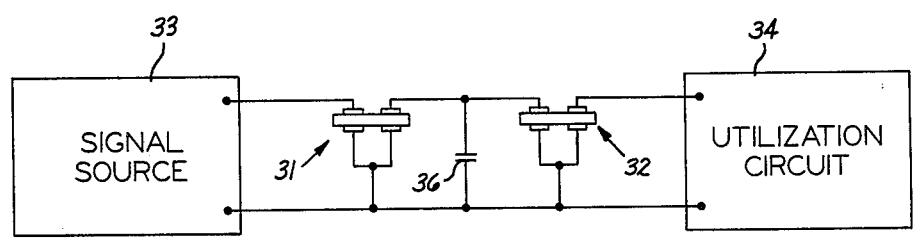
FIG. 2 is a diagrammatic representation of an embodiment of the instant invention wherein first and second piezoelectric monolithic crystal filters are coupled in tandem.

FIG. 2 diagrammatically depicts the instant inventive concept which overcomes the aforementioned problems. A first and a second MCF 31 and 32, respectively, are shown arranged in cascade or tandem relationship between a signal source 33 and a utilization circuit 34 with a capacitor 36 electrically coupling the output of the first MCF to the input of the second MCF. The MCF's 31 and 32 each have a different fundamental frequency and a plurality of overtone frequencies. Accordingly, each MCF 31 or 32 will pass frequencies which fall within narrow bands centered about their fundamental and overtone frequencies. However, only one of the overtone frequency bands of the MCF 31 will be the same as the overtone frequency band of the MCF 32 and only that band of frequencies will pass, substantially unsuppressed, from the signal source 33 to the utilization circuit 34 via the coupled MCF's. All frequencies outside the common overtone pass band will be attenuated.

Figure 3A:
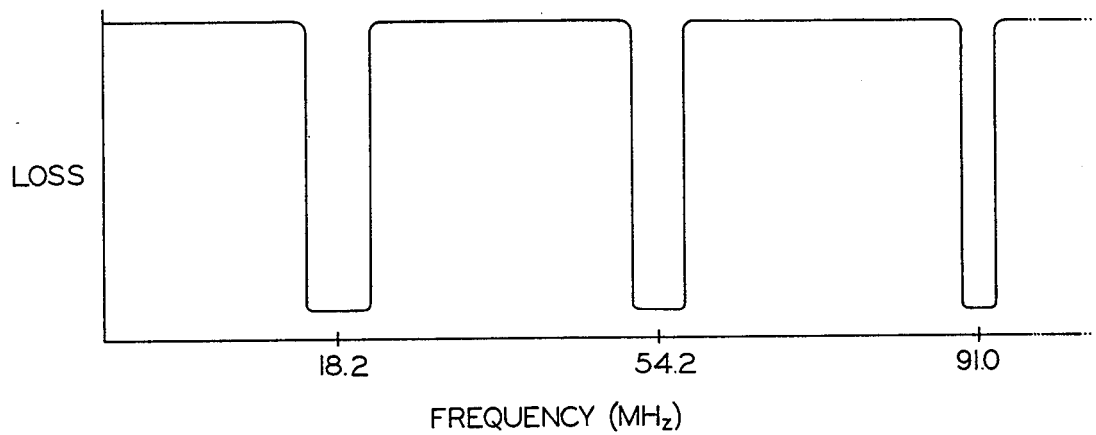
FIGS. 3A, 3B and 3C are frequency response curves of the coupled monolithic crystal filters shown in FIG. 2.
Figure 3B:
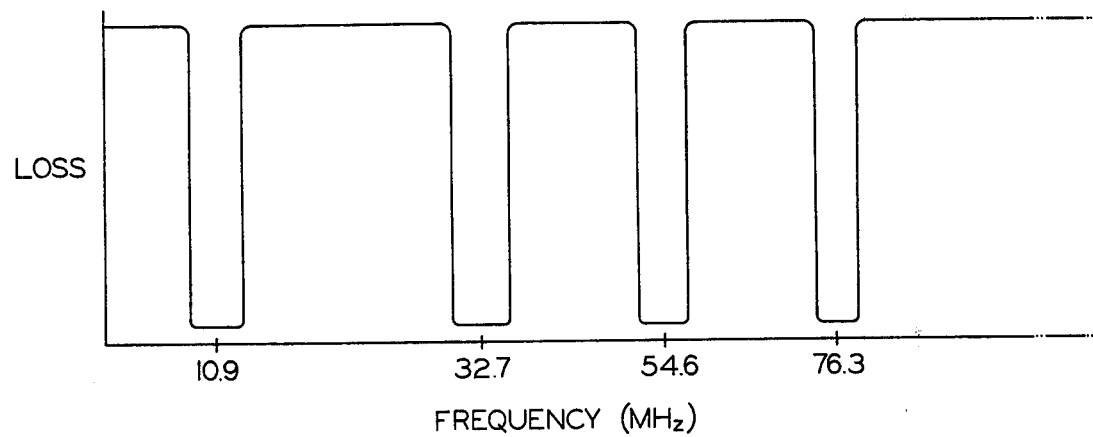

A specific working embodiment of the instant invention employed a MCF 31 in which the wafer 21 was 0.003 inch (0.008 cm) thick and the diameter was 0.220 inch (0.559 cm). The MCF 31 had a fundamental frequency pass-band about a center frequency of 18.2 MHz and a frequency pass-band about a center frequency of a third overtone frequency of 54.6 MHz (see FIG. 3A). MCF 32 had a wafer 21 0.006 inch (0.015 cm) thick and a diameter of 0.590 inch (1.519 cm). The MCF 32 had a fundamental frequency pass-band about a center frequency of 10.9 MHz and a frequency pass-band about a center frequency of a fifth overtone frequency of 54.6 MHz (see FIG. 3B). The MCF's 31 and 32 were coupled by the coupling capacitor 36 of 7 uuf which also controls the width of the pass-bands.

Figure 3C:
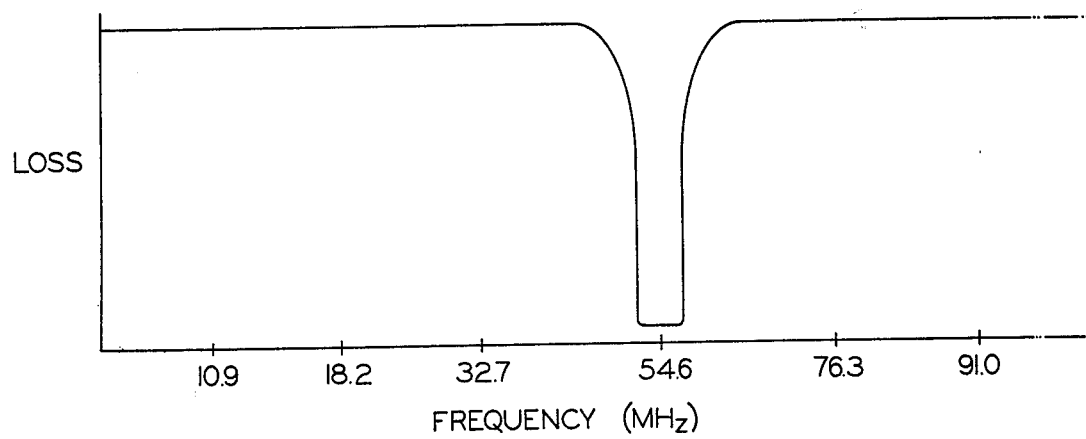

A broad spectrum of frequencies (i.e., 100 KHz to 100 MHz) was presented to the tandem coupled combination of MCF's 31 and 32 by the signal source 33 which resulted in a narrow band of frequencies about the overtone frequency of 54.6 MHz being received at the utilization circuit 27, as represented in FIG. 3C.

Although two monolithic crystal filters 31 and 32 are coupled in tandem in the exemplary embodiment depicted in FIG. 2, the instant invention is not so limited. More than two MCF's may be used as long as at least one of the filters has a fundamental frequency band different from the other MCF's and each has one overtone band coincident with an overtone band of all the other MCF's.

Figure 4:
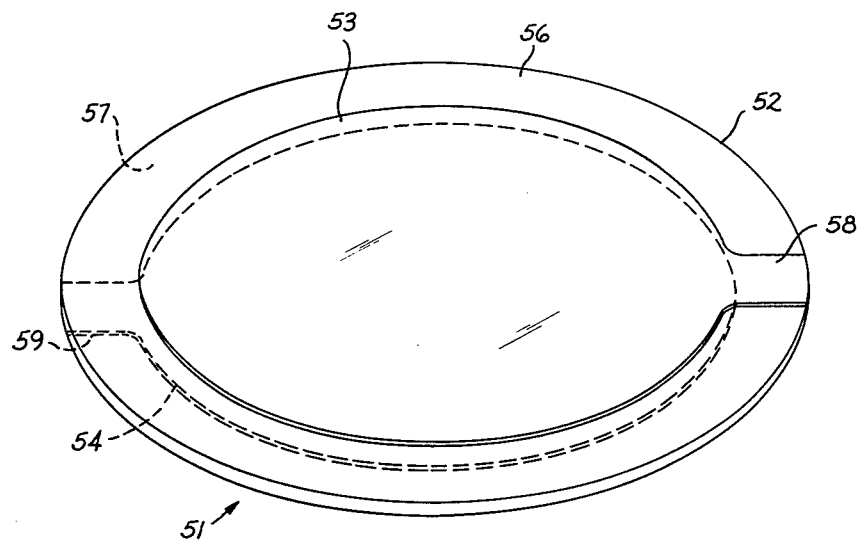
FIG. 4 is a perspective drawing of a discrete piezoelectric crystal resonator.

FIG. 4 depicts a device in the form of a discrete piezoelectric crystal resonator, generally indicated by the numeral 51, which can advantageously employ the instant inventive concepts. The discrete resonator 51 is comprised of a piezoelectric crystal wafer or plate 52 having first and second metallic electrodes 53 and 54 deposited on the opposite major faces 56 and 57, respectively, of the wafer. First and second metallic leads 58 and 59 are also deposited on faces 56 and 57, respectively, to connect the first and second electrodes 53 and 54 to circuitry (not shown). Such resonators 51 have a fundamental frequency and a plurality of overtone frequencies and the fundamental frequency is also inversely proportional to thickness of the quartz wafer 52. Accordingly, the problems hereinbefore set forth relating to the MCF 11 also apply to the discrete resonator 51 and are solved in substantially the same manner.

Figure 5:
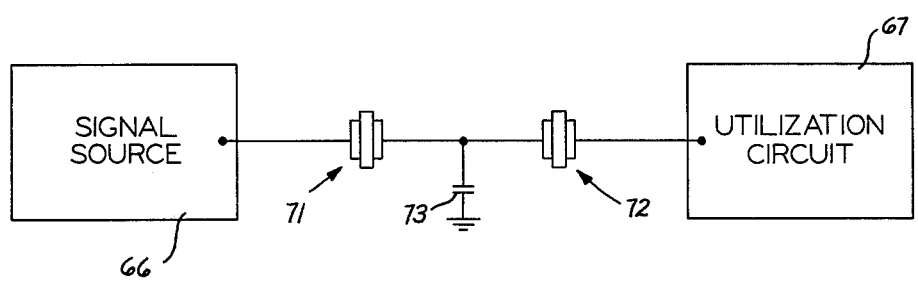
FIG. 5 is a diagrammatic representation of an embodiment of the instant invention wherein first and second piezoelectric crystal resonators are coupled in tandem.

FIG. 5 depicts a signal source 66 connected to a utilization circuit 67 via first and second piezoelectric crystal resonators 71 and 72, respectively, which are connected in a cascade or tandem and coupled electrically by a coupling capacitor 73. The fundamental frequency of the first resonator 71 is different from the fundamental frequency of the second resonator 72 but the fundamental frequencies are selected so that a predetermined one of the overtone frequencies of the first resonator will be aligned with one overtone frequency of the second resonator. Accordingly, a broad spectrum of frequencies at the output of the signal source 66 will excite the fundamental and overtone frequencies of resonator 71 which will be forwarded to resonator 72. Resonator 72 will pass only that frequency that corresponds to the aligned overtone frequency, and all other frequencies will be substantially blocked or attenuated. Thus, only the desired frequency of interest and a narrow band of the frequencies thereabout will pass from the signal source 66 to the utilization circuit 67 without the necessity of using additional expensive LC filtering.

As was the case with the MCF's 11, more than two resonators may be coupled together as long as at least one of the resonators has a fundamental frequency different from the other resonators and one overtone frequency of each resonator is aligned with the same overtone frequency of all the other resonators at the desired pass-band frequency.

In a specific working embodiment using discrete resonators, the first resonator 71 had a fundamental frequency of 18.2 MHz with a third overtone frequency of 54.6 MHz. Resonator 72 had a fundamental frequency of 10.9 MHz and a fifth overtone frequency of 54.6 MHz. The resonators 71 and 72 were coupled via the coupling capacitor 73 having a value of 56.6 uuf. The results of using such a tandem coupled resonator arrangement is substantially the same as those obtained with the coupled MCF's 31 and 32 shown in FIGS. 2, 3A, 3B and 3C.

Although the instant inventive concept has been advantageously applied to filters operating at frequencies above 40 MHz, their use is not so limited. Filters operating at frequencies below 40 MHz may be fabricated using the instant concepts. The instant concepts may be implemented whenever a band of frequencies is to be passed while all other frequencies are to be suppressed without the use of additional LC filtering external to the electromechanical filter.

What is claimed is:

1. A frequency band-pass filter which comprises:
   at least two electromechanical crystal devices having metallic electrodes formed on opposite sides of separate crystal wafers, said crystal devices being capacitively coupled in cascade relationship;
   at least two of said electromechanical crystal devices being formed on respective ones of the crystal wafers of different thicknesses so that said crystal devices have fundamental frequency bands which are different from one another; and
   each of said electromechanical crystal devices having one overtone frequency band that is coincident with one overtone frequency band of each of the other electromechanical crystal devices so that said crystal devices pass only the coincident overtone frequency band while suppressing all other frequencies.

2. A frequency band-pass filter as recited in claim 1, in which:
   the crystal wafers of said electromechanical crystal devices are not substantially less than 0.002 inch in thickness.

3. A frequency band-pass filter as recited in claim 2, in which:
   the fundamental frequency band of each of said electromechanical crystal devices is not substantially greater than 30 MHz and the coincident overtone frequency band of said crystal devices is greater than 30 MHz.

* * * * *